United States Patent
Virot et al.

(10) Patent No.: US 12,282,192 B2
(45) Date of Patent: Apr. 22, 2025

(54) METHOD FOR FABRICATING A PHOTONIC CHIP

(71) Applicant: Commissariat à l'Energie Atomique et aux Energies Alternatives, Paris (FR)

(72) Inventors: Leopold Virot, Grenoble (FR); Jean-Michel Hartmann, Grenoble (FR); Karim Hassan, Grenoble (FR); Bertrand Szelag, Grenoble (FR); Quentin Wilmart, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 317 days.

(21) Appl. No.: 18/061,523

(22) Filed: Dec. 5, 2022

(65) Prior Publication Data
US 2023/0194789 A1    Jun. 22, 2023

(30) Foreign Application Priority Data

Dec. 17, 2021    (FR) ...................................... 21 13761

(51) Int. Cl.
*G02B 6/132*    (2006.01)
*G02B 6/12*    (2006.01)
(Continued)

(52) U.S. Cl.
CPC ............. *G02B 6/132* (2013.01); *G02B 6/131* (2013.01); *G02B 6/136* (2013.01);
(Continued)

(58) Field of Classification Search
CPC .......... H01L 21/0254; H01L 21/02458; H01L 21/0242; H01L 21/02647; H01L 21/02645;
(Continued)

(56) References Cited

U.S. PATENT DOCUMENTS 7,171,095 B2 *    1/2007 Sugita ................... G02B 6/131
                                                            385/12
7,336,855 B1 *    2/2008 Vawter ................ G02F 1/01708
                                                            385/9
(Continued)

FOREIGN PATENT DOCUMENTS

EP    2 595 177 A2    5/2013

OTHER PUBLICATIONS

French Preliminary Search Report and Written Opinion Issued Jul. 18, 2022 in French Application 21 13761 filed on Dec. 17, 2021 (with English Translation of Categories of Cited Documents), 10 pages.

(Continued)

*Primary Examiner* — Marin Pichler
*Assistant Examiner* — Mary A El-Shammaa
(74) *Attorney, Agent, or Firm* — Oblon, McClelland, Maier & Neustadt, L.L.P.

(57) ABSTRACT

The fabrication of a first waveguide made of stoichiometric silicon nitride, of a second waveguide made of crystalline semiconductor material and of at least one active component optically coupled to the first waveguide via the second waveguide. The method includes: a) the formation of an aperture which passes through an encapsulation layer of the first waveguide and emerges in or on a substrate made of monocrystalline silicon, then b) the deposition by epitaxial growth of a crystalline seeding material inside the aperture until this crystalline seeding material forms a crystalline seed on a top face of the encapsulation layer, then c) a lateral epitaxy, of a crystalline semiconductor material from the crystalline seed formed to form a layer made of crystalline semiconductor material wherein the second waveguide is then produced.

15 Claims, 7 Drawing Sheets

(51) Int. Cl.
  *G02B 6/13*   (2006.01)
  *G02B 6/136*  (2006.01)
  *H01L 21/02*  (2006.01)

(52) U.S. Cl.
  CPC .... *H01L 21/02532* (2013.01); *H01L 21/0254* (2013.01); *H01L 21/02645* (2013.01); *G02B 2006/12061* (2013.01); *G02B 2006/12169* (2013.01)

(58) Field of Classification Search
  CPC ... H01L 21/02532; G02B 6/131; G02B 6/132; G02B 6/136; G02B 2006/12061; G02B 2006/12169
  See application file for complete search history.

(56) References Cited

U.S. PATENT DOCUMENTS

| | | | |
|---|---|---|---|
| 2006/0147169 A1* | 7/2006 | Sugita | B82Y 20/00 385/39 |
| 2007/0170536 A1 | 7/2007 | Hsu et al. | |
| 2011/0049568 A1 | 3/2011 | Lochtefeld et al. | |
| 2015/0140720 A1 | 5/2015 | Collins | |
| 2016/0197111 A1 | 7/2016 | Coolbaugh et al. | |
| 2016/0223749 A1 | 8/2016 | Coolbaugh et al. | |
| 2018/0231714 A1 | 8/2018 | Collins | |
| 2019/0025513 A1 | 1/2019 | Coolbaugh et al. | |
| 2020/0026003 A1 | 1/2020 | Coolbaugh et al. | |
| 2020/0158954 A1* | 5/2020 | Coolbaugh | H01L 21/0262 |

OTHER PUBLICATIONS

Hunsperger, R., "Integrated Optics: Theory and Technology", Sixth Edition, Springer, 2002, 3 pages.

Rathman, D. et al., "Lateral Epitaxial Overgrowth of Silicon on $SiO_2$", J. Electrochem. Soc.: Solid State Science and Technology, vol. 129, No. 10, 1982, 4 pages.

Weber, K.J., et al., "Epitaxial Lateral Overgrowth of Si on (1 0 0)Si Substrates by Liquid-Phase Epitaxy", Journal of Crystal Growth, vol. 186, 1998, 6 pages.

Yu, Q. et al. "Heterogeneous Photodiodes on Silicon Nitride Waveguides", Optics Express 14824, vol. 28, No. 10, 2020, 8 pages.

* cited by examiner

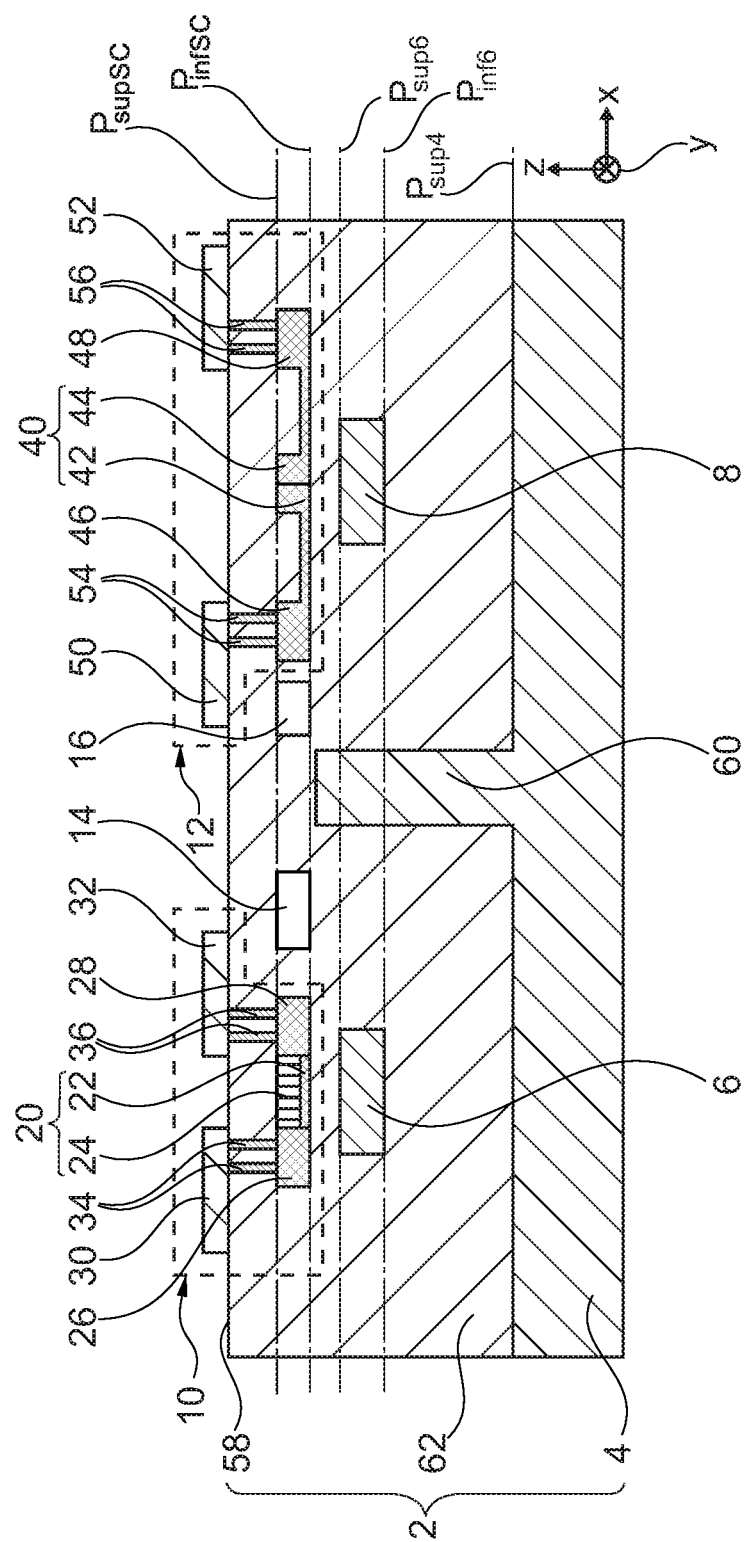

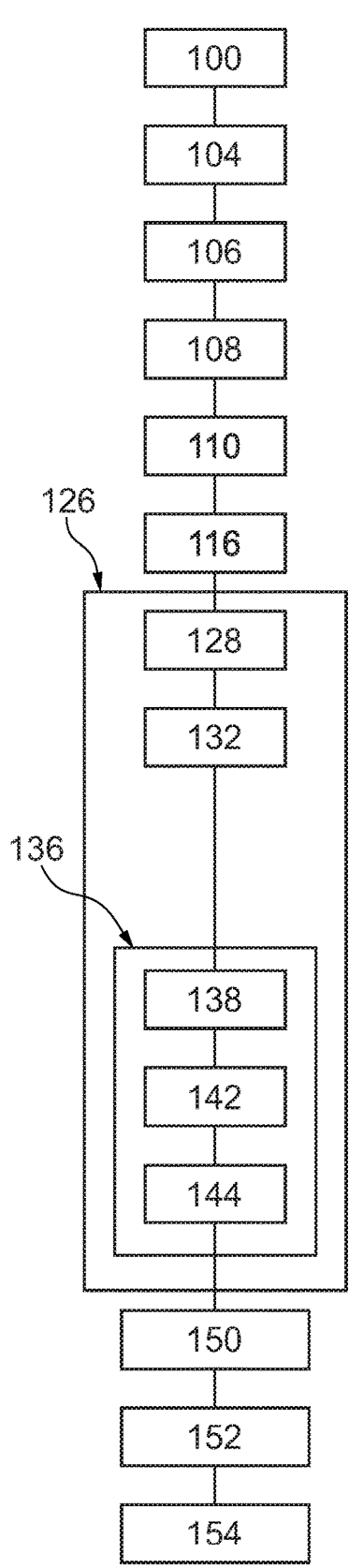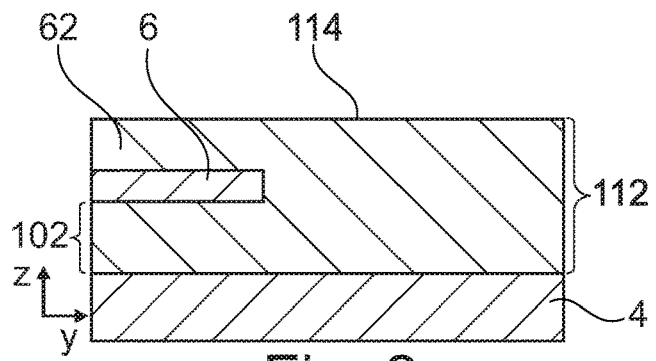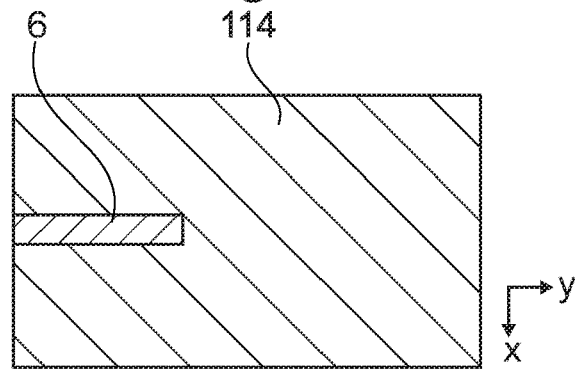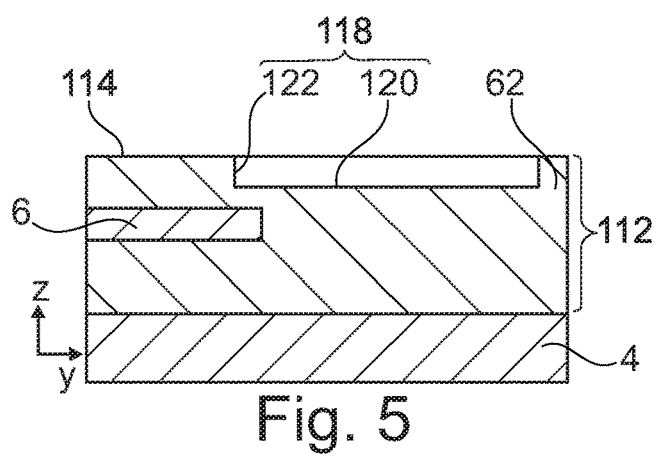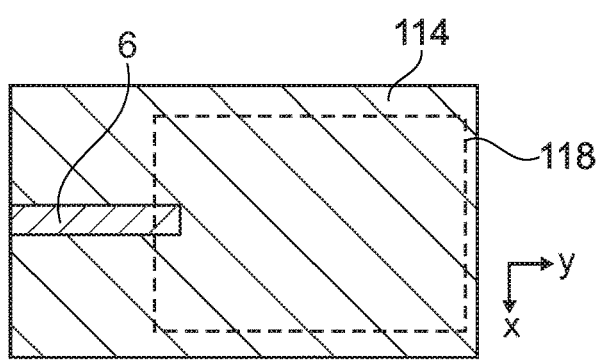

METHOD FOR FABRICATING A PHOTONIC CHIP

The invention relates to a method for fabricating a photonic chip comprising a first waveguide made of stoichiometric silicon nitride, a second waveguide made of crystalline semiconductor material and at least one active component optically coupled to the first waveguide via the second waveguide. The invention relates also to the photonic chip fabricated by this fabrication method.

For some applications, it is necessary for the waveguide made of silicon nitride to exhibit very low propagation losses, in particular in the C band, to limit the optical propagation losses. The C band is the band of wavelengths which ranges from 1530 nm to 1565 nm.

The fabrication of such waveguides made of silicon nitride entails the implementation of high-temperature heat treatments, that is to say at temperatures exceeding 1000° C. or 1200° C. These heat treatments are not compatible with the fabrication in the same photonic chip of active components such as photodetectors, modulators or laser sources.

Currently, to circumvent this difficulty, the waveguide made of silicon nitride is fabricated on a substrate and the active components are fabricated separately on another substrate. Then, the two substrates are assembled, for example by bonding, to obtain the photonic chip comprising both active components and a waveguide made of silicon nitride exhibiting very low propagation losses. An example of such a fabrication method is disclosed in US2018/231714A1. These known fabrication methods are complex.

Prior art is also known from US2015/140720A1 and US2016/197111A1.

The invention aims to propose a simpler method for fabricating these photonic chips. Its subject is therefore such a fabrication method.

Another subject is a photonic chip fabricated by the fabrication method.

The invention will be better understood on reading the following description given purely as a nonlimiting example and with reference to the drawings in which:

FIG. 1 is a schematic illustration, in vertical cross-section, of a photonic chip;

FIG. 2 is a flow diagram of a first method for fabricating the photonic chip of FIG. 1;

FIGS. 3 to 15 are schematic illustrations of different fabrication states encountered during the implementation of the fabrication method of FIG. 2;

In these figures, the same references are used to denote the same elements. Hereinafter in this description, the features and functions well known to the person skilled in the art are not described in detail.

Figure 7:
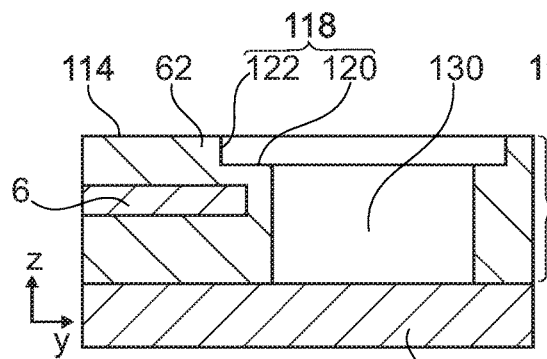
Figure 8:
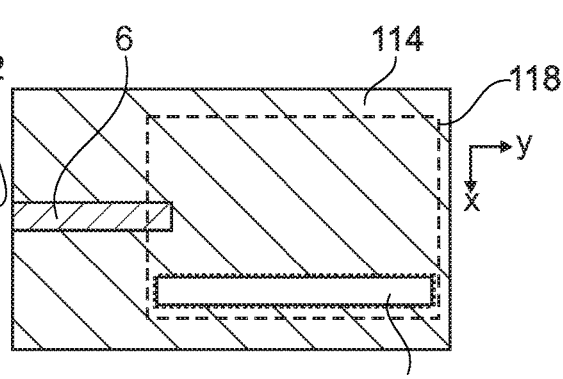
Figure 9:
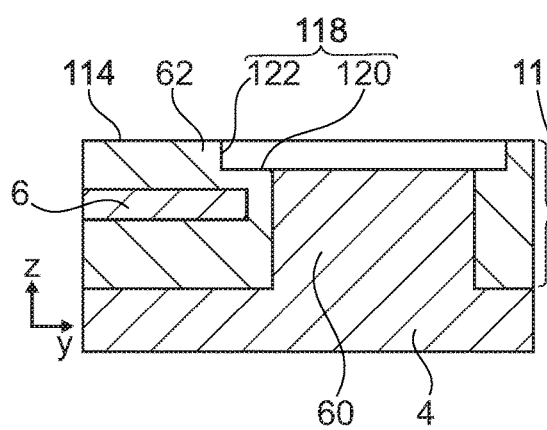
Figure 10:
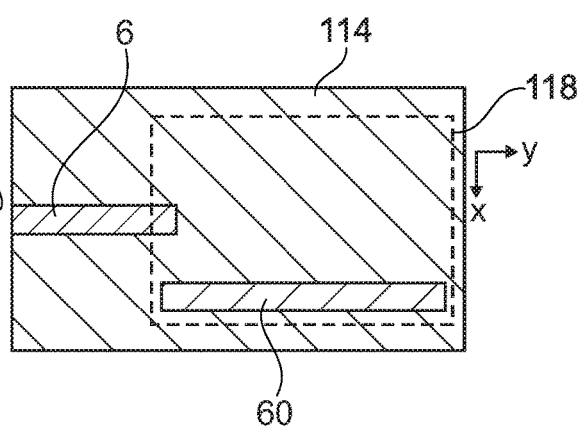
Figure 11:
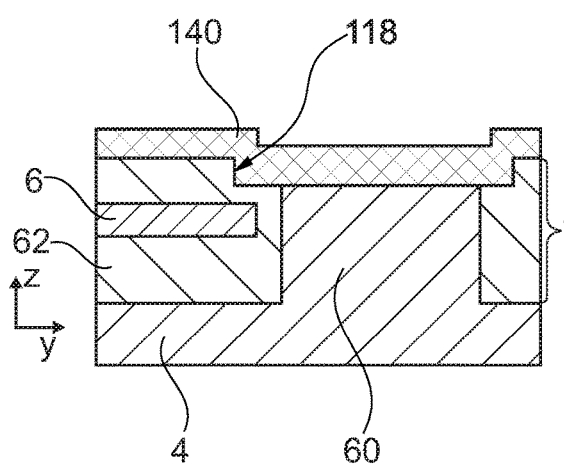

Hereinbelow, the definitions of certain terms and expressions used in this application are given in chapter I. Next, detailed examples of embodiments are described in chapter II with reference to the figures. In the next chapter III, variants of these embodiments are presented. Finally, the advantages of the different embodiments are presented in a chapter IV.

Chapter I: Terminology and Definitions

In this text, when it is indicated that a waveguide is produced in a material X, that means that the core of this waveguide is produced in this material X. The cladding of this waveguide is produced in another material of lower refractive index.

When it is indicated that an element "is produced in a material X", that means that the material X represents more than 90% or 95% or 98% of the weight of that element.

The expression "producing a waveguide in a layer of material X" denotes the fact of producing the core of this waveguide is this layer of material X. The cladding of this waveguide is produced in another material with a refractive index lower than that of this layer of material X.

When it is indicated that a waveguide is situated between lower and upper planes, that means that it is the core of this waveguide which is situated between these lower and upper planes.

Here, the mesh parameters of a crystalline material A are considered as "similar" to the mesh parameters of a crystalline material B if, for each mesh parameter of the crystalline material A, the difference between this mesh parameter and the corresponding mesh parameter of the crystalline material B is less than 5% of the value of this mesh parameter for the crystalline material A.

An "evanescent" coupling between two waveguides is a coupling which makes it possible to transfer a fraction of the optical signal which is propagated in one of the waveguides to the other. Typically, an evanescent coupling makes it possible to transfer at least 50% of the energy of the optical signal which is propagated in one of the waveguides to the other waveguide. The evanescent couplings are well known. For example, they are defined in the following book by R. G. Hunsperger: "Integrated Optics: Theory and Technology", Springer, 2002, pages 154-155. To produce an evanescent coupling between two waveguides, these waveguides must be shaped so that:

each of them has a portion facing the other waveguide, and the effective indices of these facing portions are equal.

The effective propagation index $n_{eff}$ is also known by the term "phase constant of the mode". It is defined by the following relationship: $n_g = n_{eff} - \lambda dn_{eff}/d\lambda$, in which $n_g$ is the group index and $\lambda$ is the wavelength of the optical signal guided by the guide.

The effective propagation index of a waveguide depends on the dimensions of the core of this waveguide and on the materials forming this core and the cladding of this waveguide. It can be determined experimentally or by digital simulation.

The cladding of a waveguide is generally produced in a dielectric material. In this case, the dielectric material is a dielectric material with a refractive index $n_g$ lower than the refractive index $n_c$ of the core of the waveguide. Typically, the index $n_g$ is less than or equal to $0.85*n_c$, or less than or equal to $0.75*n_c$.

In this text, the symbol "*" denotes the arithmetic multiplication operation.

The width of an element here denotes the width of this element measured in a horizontal direction at right angles to the direction of propagation of the optical signal in this element.

A cross-section of an element is a section at right angles to the direction of propagation of the optical signal in this element.

The expression "very low propagation loss" denotes a waveguide in which the propagation losses, at the wavelength of the useful optical signals which are propagated in this waveguide, are less than 4 dB/m and, preferably, less than 3 dB/m or 2 dB/m. In this text, unless indicated otherwise, a waveguide which exhibits very low propagation losses denotes a waveguide for which the propagation losses in the C band are less than 4 dB/m and, preferably, less than 3 dB/m or 2 dB/m.

The C band is the band of wavelengths which ranges from 1530 nm to 1565 nm.

Chapter II: Examples of Embodiments

FIG. 1 represents a photonic chip 2 comprising, in succession, deposited one on top of the other in a vertical direction:
- a substrate 4 made of monocrystalline silicon,
- two waveguides 6 and 8 made of silicon nitride, and
- two active photonic components 10 and 12.

The vertical direction in FIG. 1 and the subsequent figures is represented by a direction Z of an orthogonal reference frame XYZ. The directions X and Y are horizontal directions. Hereinbelow, the terms such as "upper", "lower", "above", "below" and the like are defined with respect to the direction Z.

The substrate 4 extends primarily in a horizontal plane called plane of the substrate. The thickness of the substrate 4 is typically greater than 5 µm or 10 µm or more. The top face of the substrate 4 extends in a horizontal plane $P_{sup4}$.

The guides 6 and 8 each extend vertically from a same lower plane $P_{inf6}$ to a same upper plane $P_{sup6}$. The planes $P_{inf6}$ and $P_{sup6}$ are horizontal. The plane $P_{inf6}$ is separated from the plane $P_{sup4}$ by a vertical distance greater than 1 µm or 2 µm. The plane $P_{sup6}$ is separated from the plane $P_{inf6}$ by a vertical distance greater than 200 nm and, generally, less than 900 nm or 700 nm or 500 nm or 350 nm. This vertical distance corresponds to the thickness es of the guides 6 and 8. The vertical distance between the planes $P_{sup6}$ and $P_{sup4}$ is greater than 1 µm and, generally, greater than 3 µm or 4 µm.

The guides 6 and 8 are used to guide an optical signal at a wavelength $\lambda_{SO}$. Typically, the wavelength $\lambda_{SO}$ is between 1000 nm and 2000 nm. Here, by way of illustration, the wavelength $\lambda_{SO}$ lies in the C band. In FIG. 1, the guides 6 and 8 are represented in the particular case in which the direction of propagation of the optical signal in these guides is parallel to the direction Y. Thus, only the cross-section of the guides 6 and 8 is visible in FIG. 1. The length of the guides 6 and 8 is several times greater than their width.

To limit the propagation losses of the optical signal, the guides 6 and 8 are produced in stoichiometric silicon nitride with very low propagation losses. The composition of the stoichiometric silicon nitride is defined by the following formula: $Si_3N_4$. To obtain very low propagation losses in the C band, the guides 6 and 8 are produced in stoichiometric silicon nitride deposited by a chemical vapour deposition method followed by an annealing. This method for fabricating the guides 6 and 8 is described in more detail with reference to FIG. 2.

The active components 10 and 12 are optical components which, when they are powered:
- modify the amplitude or the phase of the optical signal which passes through them or generate an optical signal, or
- measure the amplitude or the phase of the optical signal which passes through them.

For example, the components 10 and 12 are chosen from the group composed of:
- a modulator of the amplitude and/or of the phase of the optical signal,
- a photodetector which measures the amplitude of the optical signal, and
- a laser source which generates an optical signal.

These various active components have in common that they each comprise electrical contact ports used to electrically power them and/or to measure the electrical signal that they generate when they are passed through by an optical signal.

Each of these active components comprises an active part which is passed through by the optical signal. The active parts of the active components are produced in portions, respectively, of waveguides 14 and 16. The waveguides 14 and 16 are waveguides made of crystalline semiconductor material.

In FIG. 1, the cross-section of the guides 14 and 16 is represented alongside the components 10 and 12. However, in reality, the guides 14 and 16 are situated in the extension, in the direction Y, of the active parts of the components 10 and 12. Thus, in reality, the guides 14 and 16 are situated in front of or behind the active parts represented.

The guides 14 and 16 are guides in which the active parts, respectively, of the components 10 and 12 are produced. The guides 14 and 16 are directly optically coupled, by evanescent couplings, respectively, to the guides 6 and 8.

In this embodiment, the guides 14 and 16 are produced in the same crystalline semiconductor material as that of the substrate 4, that is to say made of monocrystalline silicon. These guides 14 and 16 are described in more detail in the description of their fabrication method.

The cores of the guides 14 and 16 each extend from a horizontal lower plane $P_{infSC}$ to a horizontal upper plane $P_{supSC}$. The plane $P_{infSC}$ is separated from the plane $P_{sup6}$ by a vertical distance greater than 10 nm or 30 nm and, generally, less than 150 nm or 100 nm. The plane $P_{supSC}$ is separated from the plane $P_{infSC}$ by a vertical distance greater than 200 nm and, generally, less than 700 nm or 500 nm. The thickness $e_{SC}$ of the guides 14 and 16 is equal to the vertical distance between the planes $P_{infSC}$ and $P_{supSC}$. Here, the thickness $e_{SC}$ is equal to the thickness $e_6$ of the guides 6 and 8. Thus, in the zone in which these guides 14 and 16 must be coupled, by evanescent coupling, respectively to the guides 6 and 8, the widths of the facing portions of the guides made of monocrystalline silicon and of silicon nitride are adjusted so that these facing portions exhibit the same effective propagation indices.

FIG. 1 is represented in the particular case in which the optical signals are propagated in the active components parallel to the direction Y. Thus, only the cross-section of these components 10 and 12 is visible. Typically, the active parts of these components 10 and 12 each extend from the plane $P_{infSC}$ to the plane $P_{supSC}$.

As an illustration:
- the component 10 is a photodiode which measures the intensity of the optical signal which passes through it, and the component 12 is a modulator which modifies the amplitude and the phase of the optical signal which passes through it.

Thus, the component 10 comprises a waveguide 20. The guide 20 extends primarily in the direction Y. It is produced in a portion of the guide 14 and optically coupled to the rest of the guide 14, typically, by an end coupling in which one end of a portion of the guide 14 comes into abutment on an end of the guide 20. Such a coupling is known as "butt coupling".

Here, the guide 20 comprises a bottom base plate 22 and a body 24 made of germanium. The base plate 22 extends from the plane $P_{infSC}$ toward the plane $P_{supSC}$. The thickness $e_{22}$ of the base plate 22 is less than or equal to 30% or 10% of the thickness $e_{SC}$. The base plate 22 extends in the extension of the guide 14. Typically, it forms only a single block of material with the guide 14. Here, the body 24 extends from the top face of the base plate 22 up to the plane $P_{supSC}$.

To the right and to the left of the guide 20, in the direction X, the component 10 comprises two doped regions, respectively 26 and 28. The region 26 has a doping of a sign opposite to the region 28. The regions 26 and 28 touch and run along the vertical flanks of the guide 20.

The component 10 also comprises two electrical contact ports 30, 32 to connect the component 10 to a device for acquiring measurements of this component 10. The port 30 is electrically connected to the region 26 by vertical metal vias 34. The port 32 is electrically connected to the region 28 by metallic vias 36.

The component 12 comprises a waveguide 40 which extends primarily in the direction Y. The guide 40 is produced in a portion of the guide 16. The guide 40 is optically coupled to the rest of the guide 16 by an end coupling similar to that used to couple the guide 14 to the guide 20.

Here, the guide 40 comprises two regions 42 and 44 of opposite doping directly in contact with one another along a vertical interface to form a PN junction diode. Here, the regions 42 and 44 are obtained by the doping of two regions of a portion of the guide 16.

Furthermore, each region 42 and 44 is extended laterally, parallel to the direction X, to form, respectively, electrical contact wings 46 and 48.

The component 12 also comprises two electrical contact ports 50, 52. The ports 50 and 52 are electrically connected, respectively, to the wings 46 and 48 by vertical metal vias, respectively 54 and 56.

The ports 30, 32, 50 and 52 are formed on an outer face 58 of the photonic chip 2. The outer face 58 extends parallel to the plane $P_{sup4}$ and is situated at more than 500 nm and, typically, at more than 1 μm or 2 μm above the plane $P_{supSC}$.

The photonic chip 2 also comprises at least one stud 60 which extends vertically from the plane $P_{sup4}$ to the plane $P_{infSC}$. The stud 60 is a residue of the fabrication method implemented to fabricate, notably, the guides 14 and 16. The stud 60 does not fulfil any function and its presence in no way modifies the operation of the various elements of the photonic chip 2.

This stud 60 corresponds to an aperture which, during the method for fabricating the photonic chip 2, is filled with a material, hereinafter called "crystalline seeding material" because it is used to form a crystalline seed on the plane $P_{infSC}$.

The crystalline seeding material is a crystalline material whose mesh parameters are similar to those of the crystalline semiconductor material in which the guides 14 and 16 are produced. In this first embodiment, the crystalline seeding material is monocrystalline silicon.

This stud 60 is sufficiently far away from the guides 6, 8, 14 and 16 and from the components 10 and 12 for the effective propagation index of these elements not to be modified by the presence of the stud 60. For example, to this end, the stud 60 is separated from each of these elements by a horizontal distance greater than $0.6\lambda_{SO}$ or greater than $0.8\lambda_{SO}$ or greater than $\lambda_{SO}$. Here, this separation distance is greater than 1 μm or 1.5 μm.

The cores of the waveguides previously described and of the active parts of the components 10 and 12 are encapsulated in a dielectric material 62. The material 62 here forms the claddings of the guides 6, 8, 14, 16, 20 and 40. For example, the material 62 is silicon oxide ($SiO_2$).

A first method for fabricating the chip 2 will now be described with reference to the flow diagram of FIG. 2 and using FIGS. 3 to 15. FIGS. 3, 5, 7, 9, 11, 12 and 14 are vertical cross-sectional views parallel to the directions Y and Z and passing through the guide 16. FIGS. 4, 6, 8, 10, 13 and 15 are top views. In these top views, the guide 6 is visible by transparency through the material 62.

Hereinbelow, only the fabrication of the guides 6 and 14 and of the component 10 is described. The teaching given in this particular case can be transposed freely to the fabrication of the guides 8 and 16 and of the component 12. Typically, the guides 6 and 8 and the guides 14 and 16 are fabricated in parallel on the same substrate 4.

The method begins with a step 100 of provision of a stack comprising the substrate 4 and a layer 102 (FIG. 3) of the material 62. The layer 102 covers the top face of the substrate 4.

During a step 104, a layer of stoichiometric silicon nitride is deposited on the top face of the layer 102. To this end, this layer is deposited by a low pressure chemical vapour deposition method. Chemical vapour deposition is known by the acronym CVD. Low pressure chemical vapour deposition is known by the acronym LPCVD. Typically, during the implementation of this vapour deposition method, the pressure of the gas is less than 300 mTorr (39 996 mPa) and, preferably, less than 150 mTorr (19 998 mPa). This deposition method makes it possible to deposit stoichiometric silicon nitride.

Next, during an annealing step 106, the deposited layer made of stoichiometric silicon nitride is heated for its propagation losses to become very low. For that, typically, the layer of stoichiometric silicon nitride is heated to a temperature of between 1000° C. and 1400° C., and preferably between 1100° C. and 1300° C., for a time that is sufficient to obtain the very low propagation losses desired. For example, the annealing time is between 1 hour and 3 hours.

Next, during a step 108, the guide 6 is produced in the deposited layer made of stoichiometric silicon nitride. For that, the layer is etched in order to obtain the width desired for the guide 6.

During a step 110, the guide 6 produced on the top face of the layer 102 is encapsulated in the material 62 to obtain an encapsulation layer 112 (FIG. 3) inside which the guide 6 is buried. At this stage, the fabrication state represented in FIGS. 3 and 4 is obtained. The layer 112 has a top face 114 (FIGS. 3 and 4) that is flat and horizontal at this stage. The guide 6 is situated between the planes $P_{inf6}$ and $P_{sup6}$.

Next, during a step 116 (FIGS. 5 and 6), the top face 114 is structured to form therein a hollow recess 118 inside which a layer made of crystalline semiconductor material will be formed.

The recess 118 is produced at the position where the guide 14 and the active part of the component 10 must be produced. Here, the guide 14 comprises a portion which is situated above and facing a corresponding portion of the guide 6 in order to obtain a direct evanescent coupling between these two guides. Thus, the recess 118 itself also extends partly above the guide 6.

This recess 118 comprises a horizontal bottom 120 surrounded by vertical walls 122. The depth of the recess 118 is equal to the height $e_{SC}$ of the guide 14 to be produced. The bottom 120 is therefore contained in the plane $P_{infSC}$. The horizontal dimensions of the recess 118 are sufficient to be able to produce the guide 14 and the active part of the component 10. In particular, the width of the recess 118 in the direction X is sufficiently great to be able to space the guide 14 and the active part of the component 10 apart from the stud 60 as described with respect to FIG. 1.

During a step 126, a layer made of crystalline semiconductor material identical to that of the guide 14 is created on the top face 114. Here, this layer made of crystalline semiconductor material is therefore produced in monocrystalline silicon.

For that, during an operation 128 (FIGS. 7 and 8), a single aperture 130 is formed at the location of the stud 60 in the bottom 122. This aperture 130 emerges here, on one side, directly on the top face of the substrate 4 and, on the opposite side, in the bottom 120. The aperture 130 therefore extends vertically from the plane $P_{sup4}$ to the plane $P_{infSC}$. Here, this aperture 130 is a trench. A trench is an aperture in which the length of the horizontal section is at least two times greater than its width. The length $Lo_{130}$ of the aperture 130 extends essentially parallel to the guide 14 to be produced. The length of this aperture 130 therefore extends here parallel to the direction Y. The length $Lo_{130}$ is close to the length $Lo_{118}$ of the recess 118 in the direction Y. For example, the length $Lo_{130}$ is greater than or equal to $0.8*Lo_{118}$ or to $0.9*Lo_{118}$. The length $Lo_{130}$ is less than the length $Lo_{118}$.

The width $La_{130}$ of the aperture 130 is two times smaller than its length $Lo_{130}$. Here, the width $La_{130}$ is chosen to be greater than $a_{130}*h_{infSC}$, in which:

$h_{infSC}$ is equal to the vertical distance between the plane $P_{sup4}$ and the plane $P_{infSC}$, and $a_{130}$ is a desired form ratio which allows the aperture 130 to be completely filled with the selected crystalline seeding material.

Typically, the ratio $a_{130}$ is greater than ⅒ or ¼ and less than ¾ or ½. Preferably, the ratio $a_{130}$ is chosen to be as small as possible to limit the bulk of the stud 60.

During an operation 132 (FIGS. 9 and 10), the crystalline seeding material is deposited inside the aperture 130. Here, the crystalline seeding material is monocrystalline silicon. It is deposited by epitaxial growth from the substrate 4, that is to say from the bottom of the aperture 130. This is a localized and selective epitaxy of monocrystalline silicon. Such epitaxy is known by the acronym SEG ("Selective Epitaxy Growth"). This epitaxial growth is for example performed in vapour phase. The epitaxial growth is stopped when the monocrystalline silicon deposited in the aperture 130 comes flush with the bottom 120 or forms a protuberance on this bottom 120.

During the operation 132, the monocrystalline silicon has to grow over a great height $h_{infSC}$ while retaining the same mesh parameters as those of the substrate 4 to form a crystalline seed that is as pure as possible on the bottom 120. A crystalline seed becomes increasingly more pure as it exhibits fewer crystallization defects. In particular, the appearance of polycrystalline silicon in the crystalline seed must be avoided. To observe this constraint, hydrochloric acid (HCl) is added in the gaseous mixture used to grow the monocrystalline silicon inside the aperture 130. For example, the method described in the following article is implemented, except that the growth of the monocrystalline silicon is stopped as soon as the monocrystalline silicon comes flush with the bottom 120 and without seeking to obtain a lateral growth of the monocrystalline silicon inside the recess 118: D. D. Rathman, D. J. Silversmith, and J. A. Burns: "Lateral Epitaxial Overgrowth of Silicon on SiO2", J. Electrochem. Soc., vol. 129, n° 10, p. 2303-236 October 1982, doi: 10.1149/1.2123499.

At this stage, the stud 60 is obtained and the top end of the stud 60 forms a crystalline seed made of monocrystalline silicon on the top face of the layer 112 and, more specifically here, on the bottom 120.

Preferably, at the end of the operation 132, any trace of oxide is cleaned on the crystalline seed obtained. For example, for that, cleaning with hydrofluoric acid is performed.

During an operation 136, a lateral epitaxy, from the crystalline seed produced on the bottom 120, is executed. This lateral epitaxy allows the recess 118 of crystalline semiconductor material to be completely filled. In this embodiment, to this end, a solid phase lateral epitaxy is performed. For that, during a sub-operation 138 (FIG. 11), a layer 140 of amorphous silicon is deposited over the entire top face 114 of the layer 112. For example, the amorphous silicon is deposited by implementing a chemical vapour deposition method. The layer 140 completely fills the recess 118. To this end, its thickness is greater than or equal to the thickness $e_{SC}$. The layer 140 here overflows out of the recess 118 and covers all of the top face 114.

Figure 12:
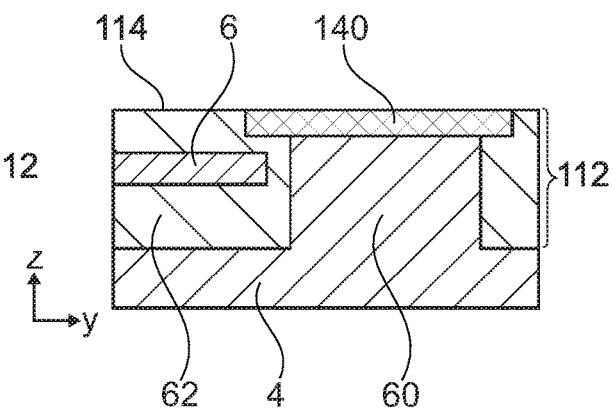
Figure 13:
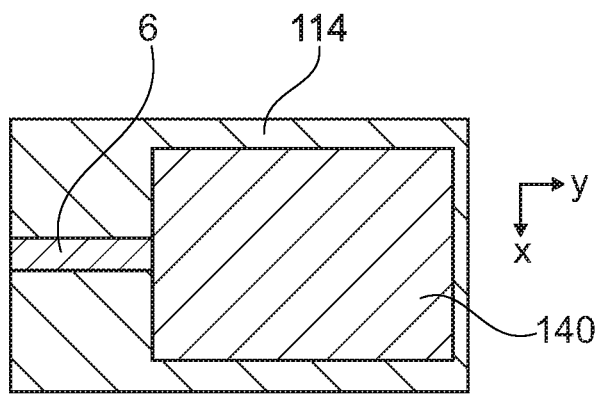
Figure 14:
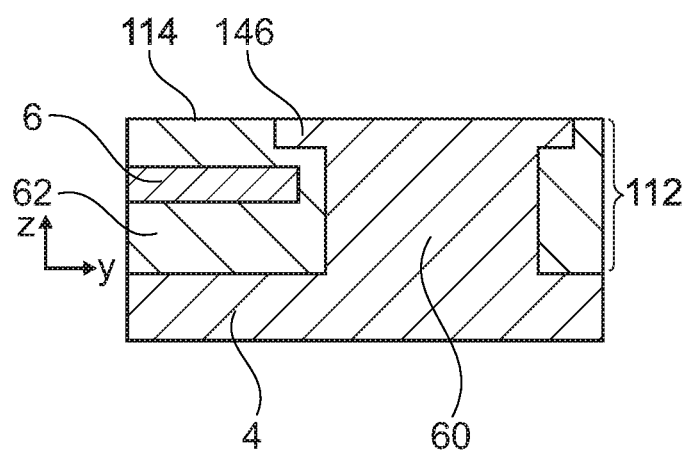
Figure 15:
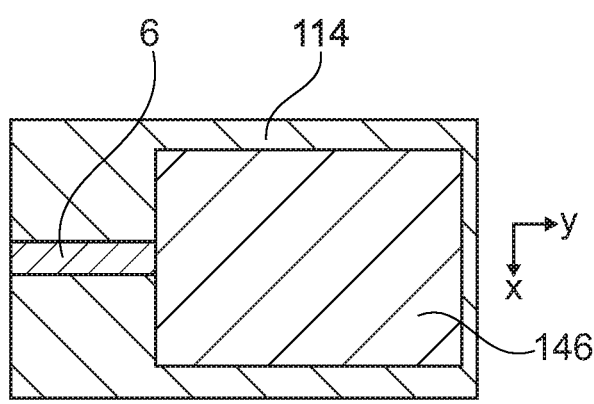
Figure 16:
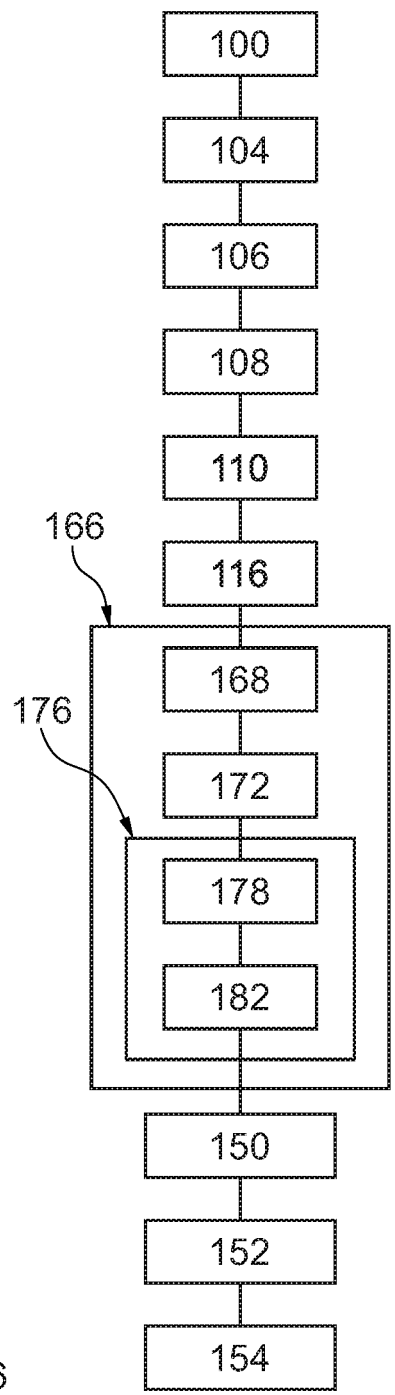
FIG. 16 is a flow diagram of a second method for fabricating the photonic chip of FIG. 1.
Figure 17:
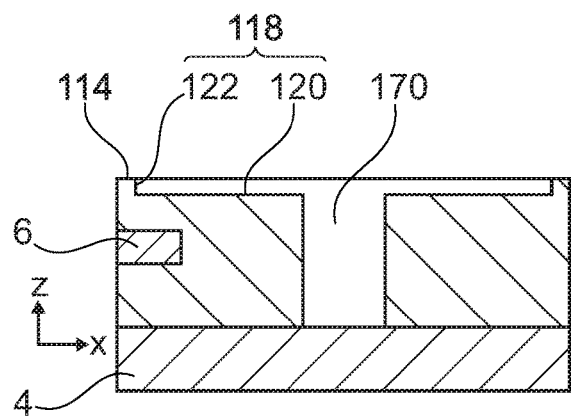
FIGS. 17 to 23 are schematic illustrations of different fabrication states encountered during the implementation of the method of FIG. 16.

Next, during a sub-operation 142 (FIGS. 12 and 13), the portions of the layer 140 situated outside of the recess 118 are eliminated. For example, for that, a chemical-mechanical polishing is executed. This polishing is better known by the acronym CMP. This polishing is stopped when the top face 114 outside of the recess 118 is bared. The fabrication state represented in FIGS. 12 and 13 is then obtained. At this stage, the recess 118 is completely filled with amorphous silicon and the thickness of this amorphous silicon is equal to the depth of the recess 118, that is to say equal to the thickness $e_{SC}$.

Next, during a sub-operation 144 (FIGS. 14 and 15), the layer 140 is subjected to an annealing at a temperature which provokes the crystallization from the crystalline seed formed on the bottom 120. Here, this crystallization temperature is less than the melting point of the monocrystalline silicon. In this case, the epitaxy performed is said to be "in solid phase" because, during the crystallization of the layer 140, the latter remains in the solid state. For example, in the case of the layer 140 made of amorphous silicon, the temperature of the annealing is equal to 700° C. The annealing time needed to provoke the crystallization of the layer 140 is generally between 1 s and 10 s. At the end of the sub-operation 144, the layer 140 is transformed into a layer 146 made of monocrystalline silicon. The operation 136 and the step 126 are then finished.

Next, during a step 150, the guide 14 and the active part of the component 10 are produced in the layer 146 created in the step 126. The guide 14 and the active part of the component 10 are produced at a location that is as far away as possible from the stud 60. For example, for that, the guide 14, the base plate 22 and the regions 26 and 28 made of silicon are obtained by etching of the layer 146. Next, the different operations to produce the active part of the component 10 are executed. Conventionally, these operations comprise the deposition and the formation of the body 24 made of germanium on the base plate 22 and the doping of the regions 26 and 28.

When the production of the guide 14 and the active part of the component 10 has ended, during a step 152, the guide 14 and this active part are encapsulated in a dielectric material. Here, the dielectric material is silicon oxide. For that, typically, a layer of silicon oxide is deposited on the top face 114 then this deposited layer is polished to form the outer face 58 of the chip 2.

During a step 154, the metal vias 34 and 36 are formed and then the ports 30 and 32 are produced on the outer face 58.

The fabrication of the chip 2 is then finished.

Figure 18:
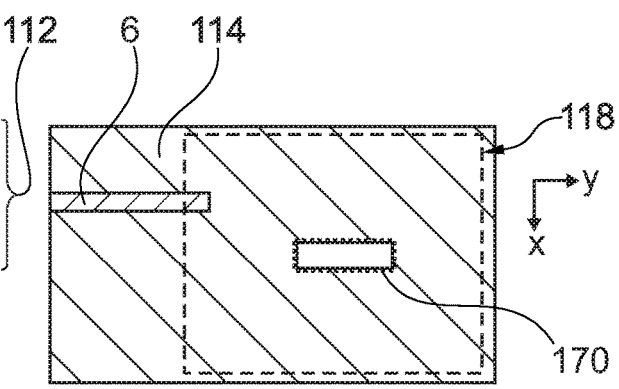
Figure 19:
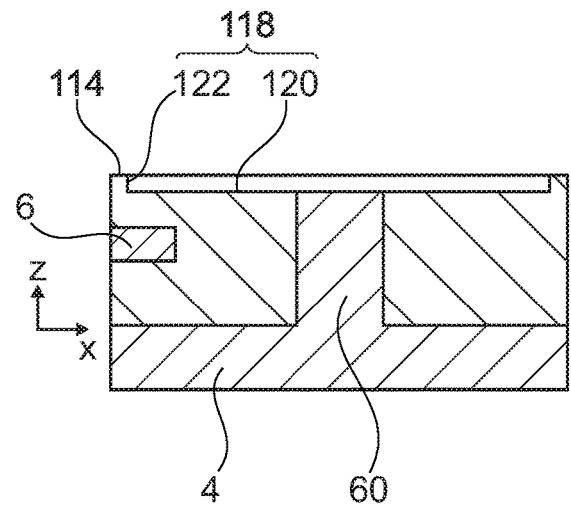
Figure 20:
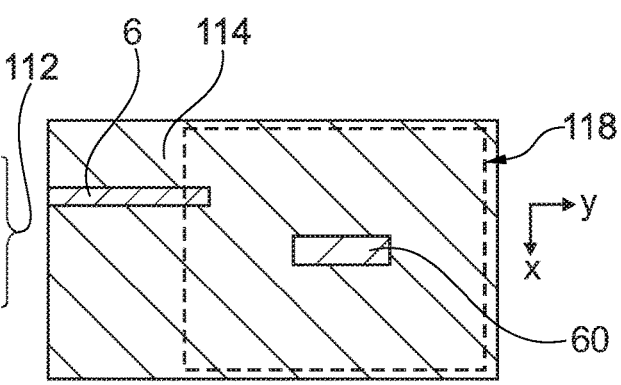
Figure 21:
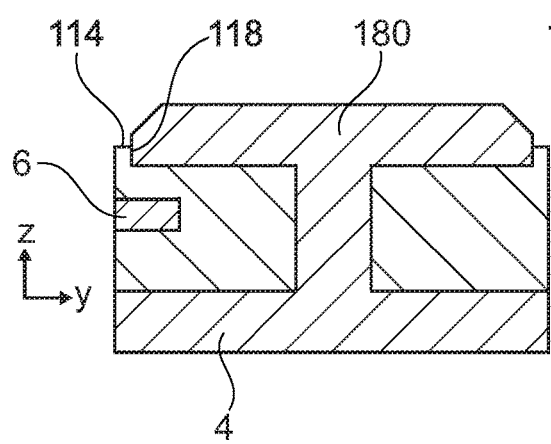
Figure 22:
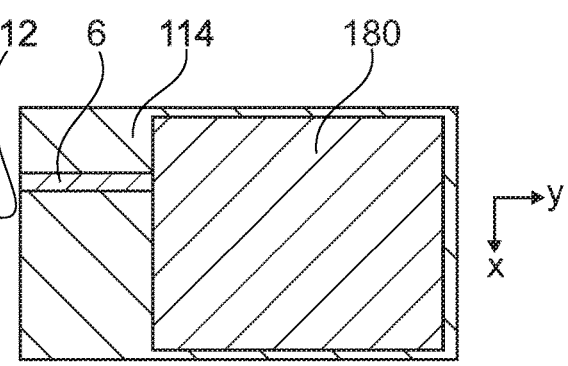

A second fabrication method is now described using the flow diagram of FIG. 16 and FIGS. 17 to 23. FIGS. 17, 19, 21 and 23 are vertical cross-sectional views, parallel to the directions Y and Z, passing through the guide 6. FIGS. 18, 20 and 22 are top views. In these top views, the guide 6 is visible by transparency through the material 62.

This second fabrication method is identical to the first fabrication method except that the step 126 of creation of the layer made of crystalline semiconductor material is replaced by a step 166 of creation of this layer made of crystalline semiconductor material.

The step 166 begins with an operation 168 (FIGS. 17 and 18) of formation of an aperture 170. This operation 168 is identical to the step 128 except that the aperture 170 is produced at the centre of the bottom 120 such that the distances which separate, in the directions X and Y, the vertical walls 122 of the recess 118 from the closest edge of this aperture 170 are all equal. Here, given that the horizontal section of the recess 118 is rectangular, the horizontal section of the aperture 170 is also rectangular. In this embodiment, the horizontal section of the aperture 170 is deduced by scaling of the horizontal section of the recess 118. Preferably, the factor k of this scaling is less than 0.7 or 0.5.

Next, during an operation 172 (FIGS. 19 and 20), the crystalline seeding material is deposited inside the aperture 170. This operation 172 is for example identical to the operation 132.

During an operation 176 (FIGS. 21 and 22), a lateral epitaxy, from the crystalline seed produced on the bottom 120, is executed. Here, it is a lateral epitaxy in vapour phase. For that, during a sub-operation 178, a layer 180 made of monocrystalline silicon is directly deposited inside the recess 118 until the interior of this recess 118 is completely filled.

To this end, the lateral growth of the monocrystalline silicon is prioritized over its vertical growth. The lateral growth corresponds here to a horizontal growth of the monocrystalline silicon. Such a method is known by the acronym ELOG ("Epitaxial Lateral Over-Growth"). For example, by contrast to the epitaxial growth implemented to fill the aperture 170, the lateral growth is prioritized by changing the chemical composition of the gas from which the monocrystalline silicon is deposited and/or the temperature of this gas and/or the pressure of this gas. For example, the method for lateral growth of the silicon described in the article by D. D. Rathman, previously cited, is appropriate.

The lateral growth is interrupted only after all of the recess 118 has been filled with monocrystalline silicon. At this stage, the thickness of the layer 180 is greater than the depth of the recess 118. Thus, the layer 180 comprises an over-thickness protruding above the top face 114.

During a sub-operation 182 (FIG. 23), the over-thickness of the layer 180 which extends above the top face 114 is eliminated, for example by chemical-mechanical polishing. This sub-operation 182 is for example identical to the sub-operation 142.

Figure 23:
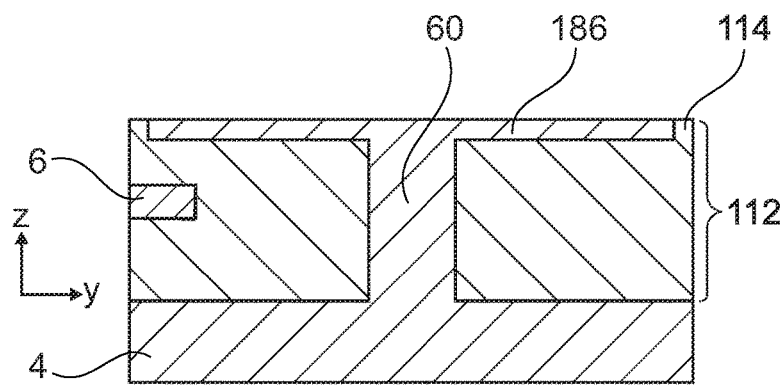

Once this over-thickness is eliminated, the fabrication state represented in FIG. 23 is obtained. More specifically, at the end of the step 176, a layer 186 made of monocrystalline silicon has been created. This layer is for example identical to the layer 146. At this stage, the operation 176 and the step 166 are finished.

The rest of the steps of the second method are identical to those described in the case of the first fabrication method.

Figure 24:
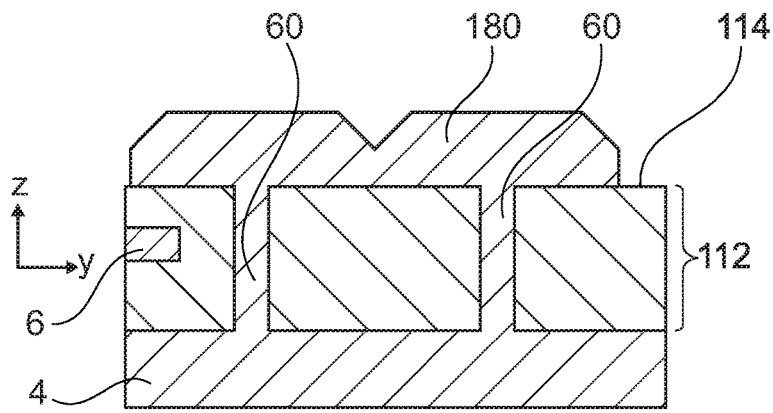
FIGS. 24 to 28 are schematic illustrations, in vertical cross-section, each illustrating a fabrication state encountered during the implementation of respective variants of the fabrication methods of FIGS. 2 and 16.

A third fabrication method is illustrated using FIG. 24. The third fabrication method is identical to the second fabrication method except that, during the operation 168, several apertures 170 evenly spaced apart from one another are formed in the bottom 120 of the recess 118.

In this case, the step 172 results in the formation of several crystalline seeds on the bottom 120. Next, during the sub-operation 178, the monocrystalline silicon grows laterally from each of these crystalline seeds. The lateral growth continues until the various blocks of monocrystalline silicon which each grow from a respective crystalline seed inter-penetrate. By virtue of that, it is possible to completely and more rapidly fill the recess 118.

The meeting of the various blocks then forms the layer 180 which completely fills the recess 118.

Figures 25, 26:
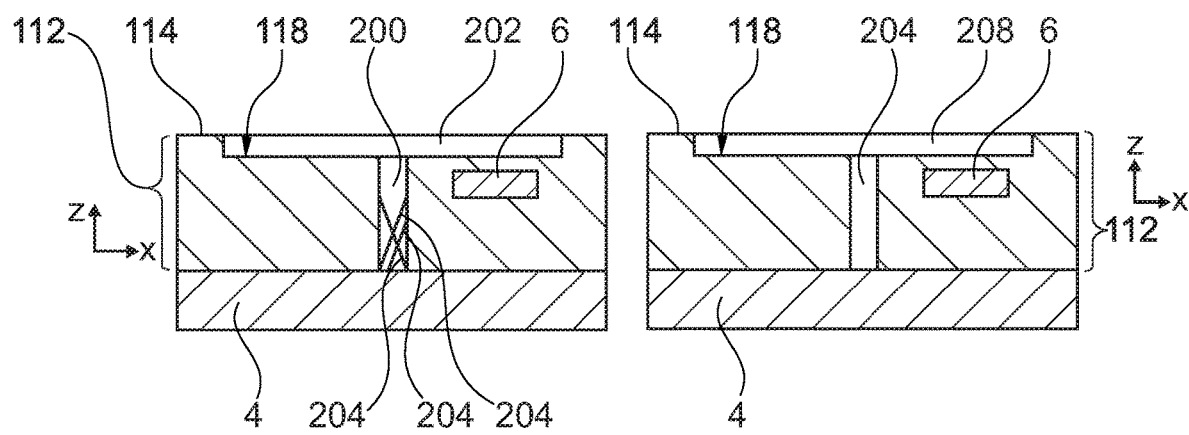

A fourth fabrication method is illustrated using FIG. 25. FIG. 25 and the subsequent figures are vertical cross-sections, parallel to the directions X and Z, passing through the part of the guide 6 situated under the fabricated layer made of crystalline semiconductor material.

This fourth fabrication method is for example identical to the first or to the second fabrication method, except that:
the crystalline seeding material is germanium, and
the crystalline semiconductor material is also germanium.

Thus, according to this fourth fabrication method, the stud 60 is replaced by a stud 200 and the layer 146 is replaced by a layer 202. The stud 200 and the layer 202 are identical, respectively, to the stud 60 and to the layer 146, except that they are produced in crystalline germanium.

In this fabrication method, the mesh parameter of the crystalline seeding material is not identical to that of the monocrystalline silicon, but only similar to that of the monocrystalline silicon. Consequently, defects appear during the step of deposition, by epitaxial growth, of the germanium inside the aperture 130 or 170. However, the distance between the planes $P_{sup4}$ and $P_{infSC}$ is sufficiently great for these defects to remain trapped inside the aperture 130 or 170 and do not affect the quality of the crystalline seed formed on the bottom 120 of the recess 118. This trapping phenomenon is known by the acronym ART ("Aspect Ratio Trapping"). To best exploit the ART phenomenon in the case where the aperture is a trench, this trench is disposed with respect to the substrate 4 so that the defects are propagated primarily in the width-wise direction of the trench and not in its lengthwise direction. In FIG. 25, the direction of propagation of certain defects is represented by lines 204.

When the fourth fabrication method is implemented, the guide 14 is replaced by a guide that is identical but produced in germanium.

A fifth fabrication method is illustrated using FIG. 26. FIG. 26 is identical to FIG. 25, except that the layer 202 is replaced by a layer 208 made of crystalline GaAs alloy.

The fifth fabrication method is identical to the fourth fabrication method except that, during the lateral epitaxy, the crystalline semiconductor material which grows from the crystalline seed made of germanium formed on the bottom 120 of the recess 118 is, here, a crystalline semiconductor material whose mesh parameters are not identical to the mesh parameter of the crystalline seed but only similar. Here, the crystalline semiconductor material is GaAs alloy.

Figure 27:
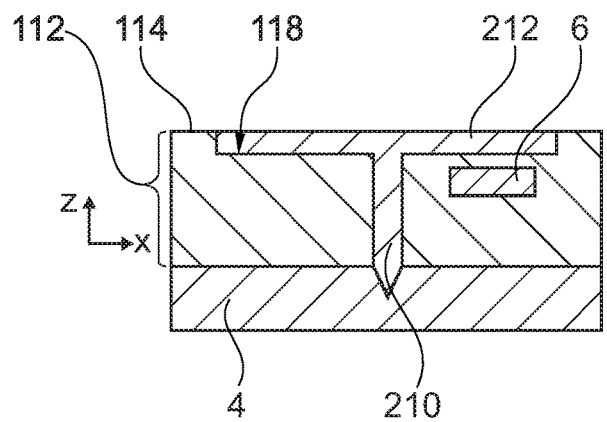

A sixth fabrication method is illustrated using FIG. 27. FIG. 27 is identical to FIG. 25, except that the stud 200 is replaced by a stud 210 and the layer 202 is replaced by a layer 212. The stud 210 is identical to the stud 60, except that:
 it is produced in a III-V material, for example, here, InP, and
 its bottom end is in the form of a spike and is driven into the substrate 4.

The layer 212 is identical to the layer 202 except that it is produced in the same III-V material as that of the stud 210.

In this sixth fabrication method, during the formation of the aperture which passes through the encapsulation layer 112, an additional wet etching of the substrate 4 is performed to reveal the mesh (111) of the monocrystalline silicon of the substrate 4. Because of this additional wet etching, the bottom of the aperture is not horizontal but forms a point, whose flanks, in the substrate 4, are parallel to the direction of the mesh (111) of the monocrystalline silicon of the substrate 4. In this sixth fabrication method, the mesh parameter of the crystalline seeding material is not similar to the mesh parameter of the monocrystalline silicon. In these conditions, to trap the defects inside the aperture 130 or 170, by implementing by the ART phenomenon, it is necessary for the defects which appear to be propagated in an oblique direction with respect to the vertical direction. Thus, the defects which appear systematically end up reaching a vertical wall of the aperture and cannot therefore be propagated to the crystalline seed formed on the bottom 120 of the recess 118. Consequently, although the mesh parameters of the crystalline seeding material and of the monocrystalline silicon are not similar, the crystalline seed made of III-V material formed on the bottom 120 exhibits very few defects.

Here, the revealing, at the bottom of the aperture 130 or 170, of the mesh (111) of the monocrystalline silicon makes it possible to obtain an oblique propagation of the defects with respect to the vertical walls of the aperture and therefore trap these defects by exploiting the ART phenomenon. Then, the steps of the sixth fabrication method are identical to those of the fourth fabrication method except that the germanium is replaced by the InP alloy.

When the sixth fabrication method is implemented, the guide 14 is replaced by a waveguide made of III-V material.

Figure 28:
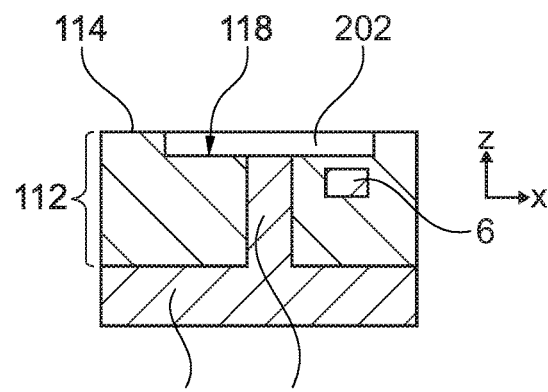

A seventh fabrication method is illustrated using FIG. 28. FIG. 28 is identical to FIG. 25 except that the stud 200 is replaced by the stud 60. Thus, this seventh fabrication method is identical to the first or the second fabrication method except that the crystalline semiconductor material is germanium.

Figure 29:
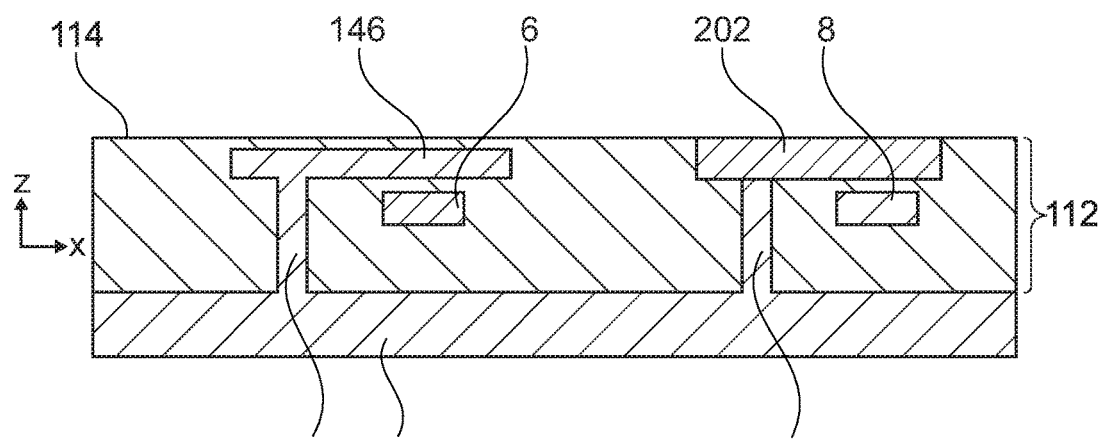
FIG. 29 is a schematic illustration, in vertical cross-section, of a fabrication state of a photonic chip fabricated by combining two of the fabrication methods described with reference to the preceding figures.

FIG. 29 illustrates the fact that it is possible to implement, during the fabrication of a same photonic chip, several of the fabrication methods previously described on the same substrate 4 to create layers at different points made of different crystalline semiconductor materials on the top face 114 of the encapsulation layer 112. Then, waveguides are produced in each of these layers. These waveguides are therefore produced in different crystalline semiconductor materials. For example, to obtain the structure represented in FIG. 29, comprising the layer 146 made of monocrystalline silicon and the layer 202 made of germanium, the first and seventh fabrication methods are both implemented during the fabrication of this same photonic chip.

Figure 30:
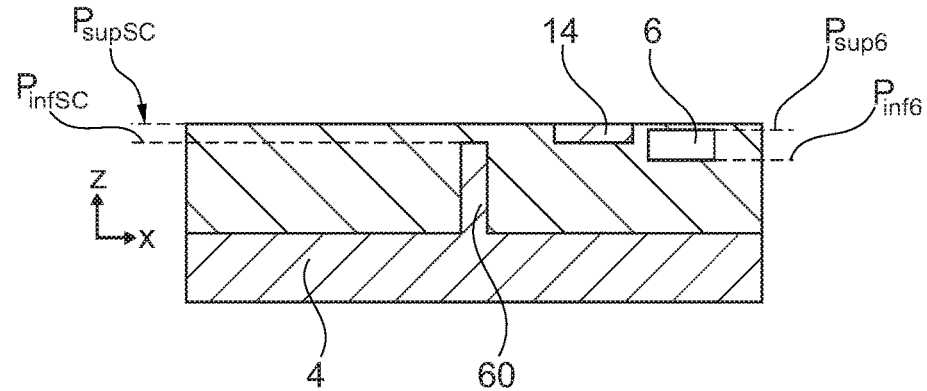
FIG. 30 is a schematic illustration, in vertical cross-section, of another fabrication state encountered during the fabrication of a variant of the photonic chip of FIG. 1.

FIG. 30 illustrates the fact that the different fabrication methods described here can also be implemented to fabricate a photonic chip in which the guide 6 is not situated under the guide 14, but substantially at the same level. In this embodiment, the plane $P_{infSC}$ is situated between the planes $P_{inf6}$ and $P_{sup6}$ or coincides with the plane $P_{inf6}$. The plane $P_{supSC}$ coincides with or is situated above the plane $P_{sup6}$. Preferably, it is situated above the plane $P_{sup6}$ in order not to thin down the guide 6 during the polishing of the layer 146 in which the guide 14 and the active part of the component 10 are then produced.

In the case of FIG. 30, the guide 6 is optically coupled directly to the guide 14 by a lateral evanescent coupling.

Chapter III: Variants

During the encapsulation of the first waveguide, a barrier layer in a dielectric material different from the material 62 is deposited on the top face of the material 62. In this case, the top face 114 of the encapsulation layer is formed in a material that is different from the material 62 used to form the cladding of the waveguide 6. For example, this stop layer is produced in $HfO_2$ or SiN.

As a variant, the hollow recess is omitted. In this case, the lateral epitaxy grows the crystalline semiconductor material on the top face 114 without a vertical wall to delimit the zone of deposition of the crystalline semiconductor material. The width of the layer 146 is then determined only by the duration of the lateral epitaxy operation.

The aperture 130 can be replaced by several trenches disposed one after the other in the direction Y.

Other forms are possible for the horizontal section of the aperture 130 or 170. For example, the horizontal section of the aperture is circular. In this case, multiple apertures of circular cross-section are produced along locations where the waveguide 14 and the active component 10 must be produced. The horizontal section of the aperture can also be square.

As previously described, for the formation of the crystalline seed on the top face to function correctly, it is not necessary for the crystalline seeding material to be monocrystalline silicon. Instead of monocrystalline silicon, the crystalline seeding material used can have mesh parameters that are similar to or different from those of the monocrystalline silicon. For example, the crystalline seeding material can be germanium or an SiGe alloy. In the latter cases, the crystalline semiconductor material is then, for example, germanium or an SiGe alloy.

For the lateral epitaxy to function correctly, it is not necessary for the crystalline semiconductor material to be identical to the crystalline seeding material. The lateral epitaxy functions as long as the crystalline semiconductor material exhibits mesh parameters similar to those of the crystalline seeding material. For example, when the crystalline semiconductor material of the second waveguide is GaAs, the crystalline seeding material can be germanium.

During the sub-operation 138, instead of depositing amorphous silicon, it is polycrystalline silicon which is deposited.

During the sub-operation 144, the solid phase epitaxy can be replaced by a liquid phase epitaxy. In the latter case, during the annealing, the temperature reached is greater than the melting point of the amorphous semiconductor material deposited on the top face 114.

During the sub-operation 178, the monocrystalline silicon can be deposited in vapour phase or in liquid phase.

During the step 150, active components other than those previously described can be produced. For example, the photodetector 12 can be replaced by a vertical or lateral PiN junction photodiode or even by an avalanche photodiode or other types of photodiodes.

Other embodiments of the active components described with reference to the figures are possible. For example, as a variant, the body 24 made of germanium of the photodiode 10 extends beyond the plane $P_{supSC}$ or stops before the plane $P_{supSC}$.

The evanescent coupling between the waveguides 6 and 14 can also be an indirect evanescent coupling. Typically, such an indirect evanescent coupling comprises:
  a first evanescent coupling directly between the waveguide 6 and an intermediate waveguide, and
  a second evanescent coupling directly between the intermediate waveguide and the waveguide 14.

Such an indirect evanescent coupling is described in detail in the application US2018231714A1.

Chapter IV: Advantages of the Embodiment Described

The forming of a crystalline seed on the top face 114 of the encapsulation layer 112 of the waveguide made of silicon nitride followed by the obtaining of the layer made of crystalline semiconductor material by lateral epitaxy from this crystalline seed makes it possible to more simply fabricate a photonic chip comprising both:
  a waveguide made of silicon nitride exhibiting very low propagation losses, and
  active components.

The etching of the hollow recess 118 followed by the filling of this hollow recess 118 by the crystalline semiconductor material makes it possible to use the top face 114 of the encapsulation layer situated outside of this recess 118 as barrier layer during polishing. That therefore makes it possible to more accurately control the thickness of the layer made of crystalline semiconductor material.

The solid or liquid phase lateral epitaxy by crystallization of the amorphous semiconductor material makes it possible to more simply obtain a layer made of crystalline semiconductor material that has a width that is much greater than its thickness.

The fact that the aperture is a trench makes it possible, during the lateral epitaxy, to have a more uniform growth front of the layer made of crystalline semiconductor material. That therefore makes it possible to reduce the number of defects in this layer made of crystalline semiconductor material.

The fact that the waveguides 6 and 14 are situated one on top of the other and coupled optically to one another by an evanescent coupling increases the tolerance to errors of placement of these waveguides 6 and 14 with respect to one another. That therefore simplifies the fabrication of the electronic chip.

The invention claimed is:

1. A method for fabricating a photonic chip comprising a first waveguide made of stoichiometric silicon nitride, a second waveguide made of crystalline semiconductor material and at least one active component optically coupled to the first waveguide via the second waveguide, said method comprising:
  providing a substrate made of monocrystalline silicon on which is deposited a layer made of dielectric material, said substrate extending primarily in a plane called "plane of the substrate", then
  vapour depositing, on the layer made of dielectric material, a layer of stoichiometric silicon nitride followed by an annealing at a temperature of between 1000° C. and 1400° C., then
  producing the first waveguide in said deposited and annealed layer of stoichiometric silicon nitride, then
  encapsulating the first waveguide in a dielectric material to obtain an encapsulation layer wherein the first waveguide is encapsulated, said encapsulation layer having a top face on the side opposite the substrate, then
  creating a layer made of crystalline semiconductor material directly on the top face of the encapsulation layer, then
  producing the second waveguide in said layer made of crystalline semiconductor material, said second waveguide being optically coupled to the first waveguide by an evanescent coupling, then
  producing the active optical component, said active optical component being connected optically to the first waveguide via the second waveguide, then
  producing electrical ports to electrically connect the active optical component to an electrical power source,
  wherein the creating of the layer made of crystalline semiconductor material comprises the following operations:
  a) forming an aperture which passes through the encapsulation layer and emerges in or on the substrate, then
  b) depositing by epitaxial growth of a crystalline seeding material inside the aperture until said crystalline seeding material reaches the top face and forms a crystalline seed on said top face, said crystalline seeding material having mesh parameters that are identical, to within plus or minus 5%, to those of the crystalline semiconductor material, then
  c) a lateral epitaxy, of the same crystalline semiconductor material as that wherein the second waveguide is produced, from the crystalline seed formed to form the layer made of crystalline semiconductor material wherein the second waveguide is then produced.

2. The method according to claim 1, wherein, before the creating of the layer made of crystalline semiconductor material, the method comprises structuring the top face to form, in said top face, a hollow recess having a bottom parallel to the plane of the substrate and walls at rights angle to the bottom, then, during the creating of the layer made of crystalline semiconductor material:
  the aperture is formed in the bottom of the hollow recess, then
  the lateral epitaxy completely fills said hollow recess.

3. The method according to claim 1, wherein the lateral epitaxy comprises:
  depositing a layer made of amorphous semiconductor material on the crystalline seed formed on the top face, then
  an annealing at a temperature suitable for provoking the crystallization of the amorphous semiconductor material from the crystalline seed.

4. The method according to claim 3, wherein the aperture is a trench with a length two times greater than its width.

5. The method according to claim 1, wherein the lateral epitaxy consists in directly depositing the crystalline semiconductor material on the top face by epitaxial growth from the crystalline seed formed on said top face.

6. The method according to claim 5, wherein the aperture is a trench with a length two times greater than its width.

7. The method according to claim 1, wherein:
during the producing of the first waveguide, said first waveguide is produced between a first lower plane and a first upper plane, these first planes being parallel to the plane of the substrate,
during the producing of the second waveguide, said second waveguide is produced between a second lower plane and a second upper plane, these second planes being parallel to the plane of the substrate and both situated above the first planes in a direction at right angles to the plane of the substrate.

8. The method according to claim 1, wherein the crystalline seeding material is monocrystalline silicon.

9. The method according to claim 1, wherein the crystalline semiconductor material is chosen from the group composed of:
silicon,
germanium,
SiGe alloy, and
a III-V material.

10. The method according to claim 9, wherein the method comprises:
executing the operations a) to c) to create a first layer made of crystalline semiconductor material, and
executing the operations a) to c) to create a second layer made of crystalline semiconductor material, said second layer made of crystalline semiconductor material being produced in a crystalline semiconductor material different from that of the first layer, then
producing the second waveguide in the first layer made of crystalline semiconductor material and the production of a third waveguide in the second layer made of semiconductor material.

11. The method according to claim 1, wherein:
the crystalline seeding material deposited inside the aperture by epitaxial growth is different from the crystalline silicon, and
the width of the aperture is adapted to trap, inside said aperture, the majority of the defects of the crystalline seeding material thus deposited by epitaxial growth.

12. The method according to claim 1, wherein the vapour deposition of the layer of stoichiometric silicon nitride is performed under a pressure lower than 300 mTorr (39 996 mPa).

13. A photonic chip obtained by a fabrication method according to claim 1, said photonic chip comprising:
a substrate made of monocrystalline silicon extending primarily in a plane called "plane of the substrate",
a first waveguide made of stoichiometric silicon nitride exhibiting propagation losses of less than 4 dB/m for wavelengths of between 1530 nm and 1565 nm, the core of said first waveguide extending, in a direction at right angles to the plane of the substrate, from a first lower plane to a first upper plane, these first planes being parallel to the plane of the substrate and the first lower plane being the plane closest to the substrate,
a second waveguide made of crystalline semiconductor material optically coupled to the first waveguide by an evanescent coupling, the core of said second waveguide extending, in the direction at right angles to the plane of the substrate, from a second lower plane to a second upper plane, these second planes being parallel to the plane of the substrate and the second lower plane being the plane closest to the substrate, and
at least one active component optically coupled to the first waveguide via the second waveguide, said active component comprising electrical ports suitable for electrically connecting it to an electrical power source,
wherein the photonic chip comprises a stud which extends from the substrate made of monocrystalline silicon to the second lower plane, said stud being produced in a crystalline seeding material which forms a crystalline seed on the second lower plane, said crystalline seeding material having mesh parameters identical, to within plus or minus 5%, to those of the crystalline semiconductor material of the second waveguide.

14. The photonic chip according to claim 13, wherein the second lower plane is situated above the first upper plane.

15. The photonic chip according to claim 13, wherein the height of the stud made of crystalline seeding material is greater than 4 μm.

* * * * *